(12) United States Patent
Nam et al.

(10) Patent No.: US 8,766,247 B2
(45) Date of Patent: Jul. 1, 2014

(54) ORGANIC LIGHT EMITTING DEVICE AND METHOD FOR MANUFACTURING THE SAME

(71) Applicant: LG Display Co., Ltd., Seoul (KR)

(72) Inventors: Dong-Hee Nam, Goyang-si (KR); Young-Gu Lee, Goyang-si (KR); Hee-Jin Kim, Yongin-si (KR); Hak-Min Lee, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 13/727,275

(22) Filed: Dec. 26, 2012

(65) Prior Publication Data

US 2013/0168653 A1 Jul. 4, 2013

(30) Foreign Application Priority Data

Dec. 30, 2011 (KR) .......................... 10-2011-0146882

(51) Int. Cl.
*H01L 33/00* (2010.01)
(52) U.S. Cl.
USPC .......................................................... 257/40
(58) Field of Classification Search
USPC .......................................................... 257/40
See application file for complete search history.

(56) References Cited

U.S. PATENT DOCUMENTS

| 7,176,070 | B2 * | 2/2007 | Lee et al. | 438/149 |
| 7,619,245 | B2 * | 11/2009 | Kim et al. | 257/40 |
| 2005/0048224 | A1 * | 3/2005 | Araya et al. | 428/1.3 |
| 2010/0283068 | A1 * | 11/2010 | Buckley et al. | 257/89 |
| 2012/0256562 | A1 * | 10/2012 | Shiobara et al. | 315/312 |
| 2012/0268042 | A1 * | 10/2012 | Shiobara et al. | 315/312 |

* cited by examiner

*Primary Examiner* — Thao P Le
(74) *Attorney, Agent, or Firm* — Brinks Gilson & Lione

(57) ABSTRACT

An organic light emitting device includes a substrate divided into and defined by first to third pixels, a first electrode disposed on the substrate and a second electrode facing the first electrode, a first light emitting layer and a second light emitting layer disposed in the first pixel and in the second pixel, respectively, between the first electrode and the second electrode, a first triplet exciton confinement layer, a third light emitting layer and a second triplet exciton confinement layer disposed over the first to third pixels in this order, on the first light emitting layer and the second light emitting layer, and a first common layer disposed between the first light emitting layer and the second light emitting layer, and the first electrode, and a second common layer disposed between the second triplet exciton confinement layer and the second electrode.

13 Claims, 4 Drawing Sheets

| | | | | | | | | |
|---|---|---|---|---|---|---|---|---|
| Ref | PEDOT 40nm | HT-601 20nm | TMM147:TMM102: TEG021 : TER-059 = 34%: 44%:16% :6% (50nm) | | | ETL 20nm | LiF/Al 0.5/100nm | |
| Red 1 | PEDOT 40nm | HT-601 20nm | TMM147:TMM102: TEG021 : TER-059 = 34%: 44%:16% :6% (50nm) | TCL 5nm | Blue (5.2%) 25nm | TCL 2nm | ETL 20nm | LiF/Al 0.5nm, 100nm |
| Red 2 | PEDOT 40nm | HT-601 20nm | TMM147:TMM102: TEG021 : TER-059 = 34%: 44%:16% :6% (50nm) | TCL 10nm | Blue (5.2%) 25nm | TCL 2nm | ETL 20nm | LiF/Al 0.5nm, 100nm |

FIG. 6

| Ref | PEDOT | HT-601 | TMM118:TMM102:TEG021 = 20%:60%:20% (40nm) | | ETL (LGD) 20nm | | LiF/Al 0.5nm/100nm |
|---|---|---|---|---|---|---|---|
| Green 1. | PEDOT 40nm | HT-601 20nm | TMM118:TMM102:TEG021 = 20%:60%:20% (40nm) | Blue (5.2%) 25nm | TCL (LGD) 2nm | ETL (LGD) 20nm | LiF/Al 0.5nm/100nm |
| Green 2. | PEDOT 40nm | HT-601 20nm | TMM118:TMM102:TEG021 = 20%:60%:20% (40nm) | TCL 5nm / Blue (5.2%) 25nm | TCL (LGD) 2nm | ETL (LGD) 20nm | LiF/Al 0.5nm/100nm |
| Green 3. | PEDOT 40nm | HT-601 20nm | TMM118:TMM102:TEG021 = 20%:60%:20% (40nm) | TCL 10nm / Blue (5.2%) 25nm | TCL (LGD) 2nm | ETL (LGD) 20nm | LiF/Al 0.5nm/100nm |

FIG. 7

| | | | | | | | |
|---|---|---|---|---|---|---|---|
| Blue 1 (Soluble +Evap) | PEDOT 40nm | HT-601 20nm | TCL 3nm | Blue (5.2%) 25nm | | ETL (LGD) 20nm | LiF/Al 0.5nm/100nm |
| Blue 2 (Soluble +Evap) | PEDOT 40nm | HT-601 20nm | TCL 5nm | Blue (5.2%) 25nm | TCL (LGD) 2nm | ETL (LGD) 20nm | LiF/Al 0.5nm/100nm |
| Blue 3 (Soluble +Evap) | PEDOT 40nm | HT-601 20nm | TCL 10nm | Blue (5.2%) 25nm | TCL (LGD) 2nm | ETL (LGD) 20nm | LiF/Al 0.5nm/100nm |

ORGANIC LIGHT EMITTING DEVICE AND METHOD FOR MANUFACTURING THE SAME

This application claims the benefit of Korean Patent Application No. 10-2011-0146882, filed on Dec. 30, 2011, which is hereby incorporated by reference as if fully set forth herein.

BACKGROUND

1. Field of the Disclosure

The present disclosure relates to an organic light emitting device, and more particularly, to an organic light emitting device, efficiency of which is improved by changing a layer structure, and a method for manufacturing the same.

2. Discussion of the Related Art

Image display devices, which display a variety of information on a screen, are being developed as a core technology of screen info-communication age. Such development is toward thinner, lighter, portable and higher-function trends. In this regard, as flat panel display devices capable of solving large weight and large volume, which are drawbacks of cathode-ray tubes (CRTs), organic light emitting displays that display images while controlling an amount of light emitted from an organic light emitting layer are attracting much attention.

Organic light emitting displays spontaneously emit light using a thin light emitting layer disposed between electrodes, thus advantageously enabling realization of a thin film like paper. Such an organic light emitting display is divided into an active matrix-type that can be selectively operated by cell drivers provided in respective pixels and a passive matrix-type that can be controlled according to respective lines.

Active matrix organic light emitting displays (AMOLED) display an image through pixels including three color (R, G, B) pixel groups arrayed in a matrix form. Each pixel includes an organic light emitting device such as an organic light emitting diode and a cell driver driving the organic light emitting diode. The cell driver includes a gate line to supply a scan signal, a data line to supply a video data signal, and at least two thin film transistors between common power lines to supply a common power signal and drive an anode of the organic light emitting diode.

The organic light emitting device includes an anode, a hole injection layer (HIL), a hole transport layer (HTL), a light emitting layer, an electron transport layer (ETL), an electron injection layer (EIL), and a cathode.

Such an organic light emitting device is generally known to be formed by separately vacuum-depositing (vacuum-evaporating) respective layers. In accordance with vacuum deposition, materials for layers to be formed are deposited in a gas state in a vacuum chamber on a substrate.

In this regard, when a vacuum chamber is used, the size of the vacuum chamber should be at least larger than that of the substrate upon which vacuum deposition is performed, and the vacuum chamber has a difficulty in securing a sufficient space of width and length enabling introduction of the substrate into the chamber, thus having a limitation of increase in size and, if possible, it is difficult to maintain the size-increased chamber under vacuum. For this reason, other methods for manufacturing organic light emitting devices have been considered.

For example, a method of forming layers in a solution state on a substrate through a solution process, without using a chamber requiring additional vacuum conditions is suggested.

However, a part of layers constituting the organic light emitting device have poor stability due to inherent characteristics of materials thereof, thus being disadvantageously unsuitable for the solution process. In particular, when a blue light emitting material is used for formation of light emitting layer through the solution process and is then applied to displays, sufficient characteristics cannot be obtained. Accordingly, in recent years, a method of separately forming a blue light emitting layer and a green light emitting layer has been suggested. Such a conventional organic light emitting device has the following disadvantages.

In recent years, a hybrid-type organic light emitting device having a structure in which a red light emitting layer and a green light emitting layers are separately formed in each pixel and a blue light emitting layers is formed throughout the pixels in common has been known.

However, since, in this structure, the blue light emitting layer is formed throughout the pixels, there are regions where the red light emitting layer overlaps the green light emitting layer and, in these regions, color purity is disadvantageously decreased due to color mixing of emitting light.

In order to increase the color purity, various structures have been suggested. However, these structures have a problem in that a driving voltage is increased, when color purity is improved. Hybrid organic light emitting devices having a structure capable of improving color purity, while reducing a driving voltage have not yet been developed.

Also, there is a demand for application of solution processes to hybrid devices, but layers unsuitable for solution processes due to inherent limitations of materials are present and, for this reason, there is a difficulty in stably applying a solution process to a plurality of layers due to damage to the surface of layers formed by a solution process when the solution process is used in conjunction with vacuum deposition.

SUMMARY OF THE INVENTION

Accordingly, the present invention is directed to an organic light emitting device and a method for manufacturing the same that substantially obviate one or more problems due to limitations and disadvantages of the related art.

An organic light emitting device includes: a substrate divided into and defined by first to third pixels; a first electrode disposed on the substrate and a second electrode facing the first electrode, the second electrode being spaced from the first electrode; a first light emitting layer and a second light emitting layer disposed in the first pixel and in the second pixel, respectively, between the first electrode and the second electrode; a first triplet exciton confinement layer, a third light emitting layer and a second triplet exciton confinement layer disposed over the first to third pixels in this order, on the first light emitting layer and the second light emitting layer; a first common layer disposed between a layer including the first light emitting layer and the second light emitting layer, and the first electrode; and a second common layer disposed between the second triplet exciton confinement layer and the second electrode.

In accordance with another aspect of the present invention, provided is a method for manufacturing an organic light emitting device including: preparing a substrate divided into and defined by first to third pixels; forming a first electrode on the substrate; forming a first common layer on the first electrode through a solution process; forming a first light emitting layer and a second light emitting layer in the first pixel and in the second pixel, respectively, on the first common layer, through a solution process; sequentially forming a first triplet exciton confinement layer, a third light emitting layer and a second triplet exciton confinement layer over the first to third pixels through a evaporation process such that these layers cover the first light emitting layer and the second light emitting layer; and forming a second electrode on the second common layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting device and a method for manufacturing the same according to the present invention will be described in detail with reference to the annexed drawings.

Figure 1:
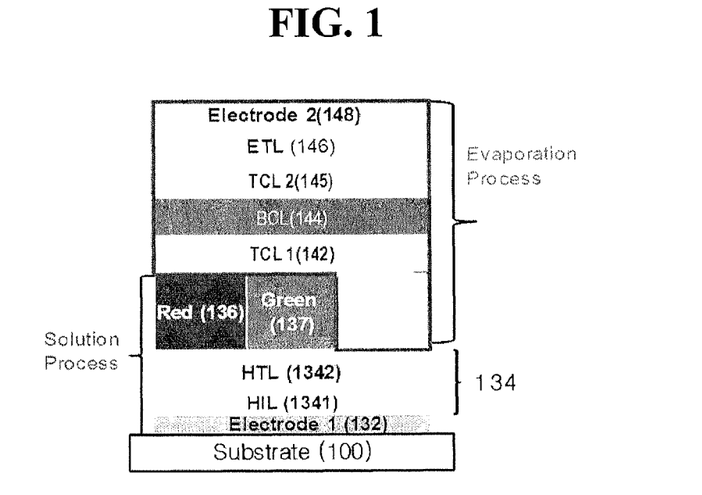
FIG. 1 is a sectional view illustrating an organic light emitting device according to an embodiment of the present invention.

FIG. 1 is a sectional view illustrating an organic light emitting device according to the present invention.

As shown in FIG. 1, the organic light emitting device includes a TFT substrate 100 divided into and defined by first to third pixels, a first electrode 132 disposed on the TFT substrate, a second electrode 148 facing the first electrode 132 while the second electrode 148 is spaced from the first electrode 132, a first light emitting layer 136 disposed in the first pixel provided between the first electrode 132 and the second electrode 148, a second light emitting layer 137 disposed in the second pixel, a first triplet exciton confinement layer (TCL) 142, a third light emitting layer 144 and a second triplet exciton confinement layer 145 sequentially disposed in the first to third pixels on the first light emitting layer 136 and the second light emitting layer 137, a first common layer 134 disposed between the layers of the first light emitting layer 136 and the second light emitting layer 137, and the first electrode 132, and a second common layer 146 disposed between the second triplet exciton confinement layer 145 and the second electrode 148.

Here, the TFT substrate 100 is provided with cell drivers, each including a thin film transistor (TFT), to independently drive respective pixels.

Also, the first to third pixels are formed to be regularly repeated. This regularity may be realized according to lines or diagonal lines.

Also, in the illustrated example, the first pixel is a red pixel, the second pixel is a green pixel and the third pixel is a blue pixel. The red light emitting layer and the green light emitting layer are formed in the corresponding pixel and the blue light emitting layer is formed over all the pixels in common.

However, in the organic light emitting device according to the present invention, combination of other colors may be changed without limitation to this color combination so long as white can be realized by mixing colors of respective light emitting layers. For example, the third pixel may be changed into a blue pixel, and the first and second pixels may be changed into yellow and green pixels, respectively.

Meanwhile, the first light emitting layer 136 and the second light emitting layer 137 are separately formed in different pixels. These layers are formed by selectively coating the first common layer 134 with a high- or low-molecular material suitable for a solution process. Here, materials constituting the first light emitting layer 136 and the second light emitting layer 137 formed by the solution process may be fluorescent or phosphorescent materials. These light emitting layers 136 and 137 include one or more dopants rendering color of emitting light included in one or more hosts.

Theoretically, phosphorescence has an about three-time higher efficiency, as compared to fluorescence. Phosphorescent or fluorescent materials included in the light emitting layers may be selected in consideration of a level of color mixing with other light emitting layers and lifetime.

Here, for example, the solution process may be selected from inkjet printing, nozzle printing, a transfer process and thermal jet printing. Such a solution process may be carried out on the substrate without using an additional mask or chamber.

Of the afore-mentioned light emitting layers, only the third light emitting layer (blue light emitting layer) is formed by depositing a low molecular material on the substrate. The reason for this is that a material for the blue light emitting layer known to date has an insufficient efficiency and low stability, as compared to other light emitting layers. If a material for the blue light emitting layer capable of exhibiting superior efficiency and improved stability even through the solution process has been developed, the blue light emitting layer may also be formed even through the solution process.

In the illustrated organic light emitting device, the third light emitting layer 144 is formed as the blue light emitting layer by deposition using a small molecules material.

Here, first and second triplet exciton confinement layers 142 and 145 disposed on the top and bottom of the third light emitting layer 144 have an electron mobility of $1.0 \times 10^{-8}$ $cm^2/s \cdot V$ or more and a hole mobility of $1.0 \times 10^{-8}$ $cm^2/s \cdot V$ or more, thus having bipolar properties having high hole mobility as well as high electron mobility.

In this case, preferably, LUMO and HOMO energy levels of the first triplet exciton confinement layer 142 are different from LUMO and HOMO energy levels of a host and a dopant, respectively, included in the third light emitting layer 144, within 0.5 eV or less. Also, preferably, LUMO and HOMO energy levels of the second triplet exciton confinement layer 145 are different from LUMO and HOMO energy levels of a host and a dopant, respectively, included in the third light emitting layer 144, within 0.5 eV or less. That is, in order to facilitate transport of holes between the first and second light emitting layers 136 and 137, and the third light emitting layer 144 which are formed as different layers, the first triplet exciton confinement layer 142 has an absolute value of HOMO energy level smaller than absolute values of the HOMO energy levels of the first to third light emitting layers 136, 137 and 144. In order to facilitate transport of electrons, the first triplet exciton confinement layer 142 has an absolute value of a LUMO energy level higher than absolute values of the LUMO energy levels of the first to third light emitting layers 136, 137 and 144. Also, in order to facilitate transport of electrons from the second triplet exciton confinement layer 145 to the third light emitting layer 144, the second triplet exciton confinement layer 145 has an absolute value of a LUMO energy level higher than that of LUMO energy level of the third light emitting layer 144.

Also, preferably, triplet energy levels T1 of the first and second triplet exciton confinement layers 142 and 145 are higher than triplet energy levels of dopants of the first to third light emitting layers 136, 137 and 144.

Here, preferably, the first triplet exciton confinement layer 142 has a thickness of about 1 nm to about 15 nm, and the second triplet exciton confinement layer 145 has a thickness of about 1 nm to about 5 nm. The first and second triplet exciton confinement layers 142 and 145 are formed to have thicknesses smaller than that of the light emitting layer using an organic material having high hole mobility as well as high electron mobility, or an organic material which is partially doped with an inorganic material in order to improve hole/electron mobility.

Meanwhile, the first triplet exciton confinement layer 142 and the second triplet exciton confinement layer 145 may be formed of a small molecules organic material, enabling application of vacuum deposition.

The first triplet exciton confinement layer 142, the third light emitting layer 144, the second triplet exciton confinement layer 145 and the second common layer 146 are formed over all the pixels in common without division of regions, which are formed by vacuum deposition. These layers are formed over the entire surface of the substrate without using any mask and without division of regions.

Here, the first common layer 134, the first light emitting layer 136 and the second light emitting layer 137 are formed through a solution process using a solution material.

The first common layer 134 includes a hole injection layer 1341 and a hole transport layer (HTL) 1342. If desired, the hole injection layer 1341 may be omitted, or may be formed as a single layer made of a mixture of a material for the hole transport layer and a material for the hole injection layer. Also, the hole injection layer 1341 and the hole transport layer 1342 may be formed as a plurality of layers including two or more layers. In all cases, the first common layer 134 functions to transport holes from the first electrode 132 to the light emitting layer (EML).

As shown in the drawing, the second common layer 146 may be formed as an electron transport layer including a single layer, or if desired, an electron injection layer may be further formed on the electron transport layer. In this case, the second common layer 146 functions to transport electrons from the second electrode 148 through the second triplet exciton confinement layer 145) to the third light emitting layer 144.

Also, one of the first electrode 132 and the second electrode 148 is formed of a transparent electrode and the other is formed of a reflective electrode, thus defining a light emission direction. For example, when the first electrode 132 is formed of a transparent material such as ITO (indium tin oxide) and the second electrode 148 is formed of a reflective metal such as Al, bottom emission is realized. On the other hand, when the first electrode 143 includes a laminate including a reflective metal of Ag/ITO and the second electrode 148 includes a metal laminate of Mg:Ag with a thickness of about 20 nm or less to provide transmittance, top emission may be realized.

Here, one of the first electrode 132 and the second electrode 148 may be patterned according to individual pixels and the patterned electrode is connected to the thin film transistor included in the cell driver of the TFT substrate to enable application of a voltage.

Hereinafter, an example in which the organic light emitting device according to the present invention is applied to an active matrix mode will be described.

Figure 2:
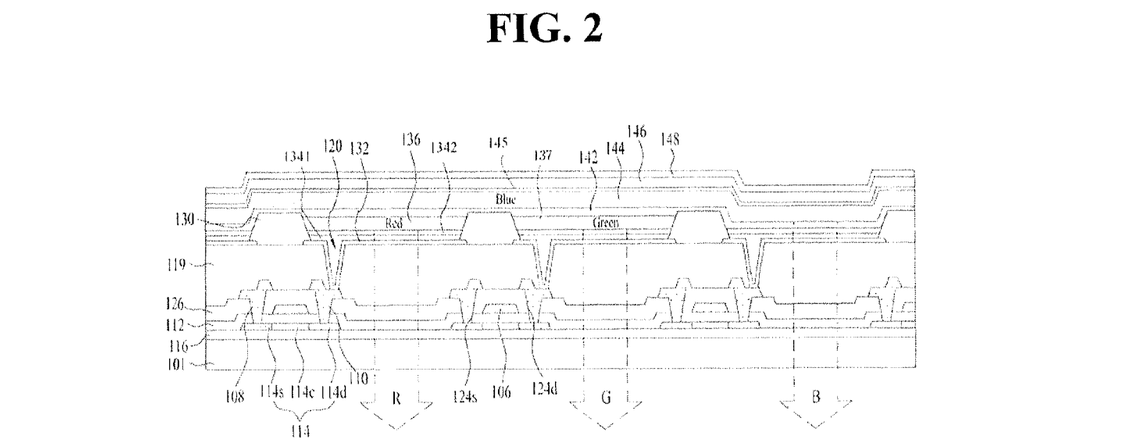
FIG. 2 is a sectional view illustrating a configuration of the organic light emitting device of FIG. 1 applied to an active matrix mode.

FIG. 2 is a sectional view illustrating a configuration of the organic light emitting device of FIG. 1 applied to an active matrix mode.

In the example shown in FIG. 2, only a single pixel unit including red, green and blue pixels is shown. This pixel unit is consecutively disposed in plural in horizontal and vertical directions.

As shown in FIG. 2, the active-matrix organic light emitting display includes a TFT substrate 100 including a driving thin film transistor and an organic light emitting device connected to the driving thin film transistor.

The driving thin film transistor includes an active layer 114, a source electrode 108 and a drain electrode 110 connected to source/drain regions 114s and 114d, respectively, disposed at both sides of the active layer 114 and a gate electrode 106 that overlaps a channel region 114c of the active layer 114. Here, the source/drain regions 114s and 114d are doped with an n-type impurity.

Also, the TFT substrate 100 includes a buffer film 116 disposed on a substrate 101, a driving thin film transistor disposed in a predetermined region on the buffer film 116, and an organic insulating film 119 that makes the entire surface including the driving thin film transistor even.

Specifically, a configuration provided on the TFT substrate 100 will be described in detail.

A buffer film 116 is formed over the entire surface of the substrate 101 and an active layer 114 is formed in a predetermined region on the buffer film 116.

The gate electrode 106 overlaps the channel region 114c of the active layer via the gate insulating film 112. Also, the source electrode 108 and the drain electrode 110 are insulated from each other such that the gate electrode 106 and an interlayer insulating film 126 are interposed therebetween.

The source electrode 108 and the drain electrode 110 are connected to the source region 114s and the drain region 114d, respectively, of the active layer 114 doped with an n+ impurity via contact holes passing through the interlayer insulating film 126 and the gate insulating film 112.

The active layer 114 may further include a light dropped drain (LDD) region (not shown) doped with an n-impurity, interposed between the channel region 114c, and the source and drain regions 114s and 114d in order to reduce off current.

Also, the organic protective film 119 may be formed of double layers including an inorganic protective film made of an inorganic insulating material and an organic protective film made of an organic insulating material.

Also, the first electrode 132 is formed in each pixel such that it is connected to the drain electrode 110.

The organic light emitting device includes a first electrode 132 connected to the drain electrode 110 of the driving thin film transistor, and includes the first common layer 134, the first light emitting layer (red light emitting layer) 136, the second light emitting layer (green light emitting layer) 137, and the first triplet exciton confinement layer 142, the third light emitting layer (blue light emitting layer) 144, the second triplet exciton confinement layer 145, the second common layer 146 formed over the entire surface of the substrate, and the second electrode 148 as shown in FIG. 1.

If desired, as shown in FIG. 2, a plurality of banks 130 may be further disposed between the first common layers 134 to divide the respective color pixels. In an example shown in FIG. 1, the bank 130 is omitted. However, banks to separate respective pixels are disposed in active matrix organic light emitting displays. However, the banks may be omitted according to the structure of light emitting displays.

When an electric field is formed between the first electrode 132 and the second electrode 148 through application of a voltage thereto, holes injected from the first electrode 132 and electrons injected from the second electrode recombine together in the first to third light emitting layers 136, 137 and 144, to produce excitons, which drop to a bottom state. At this time, the organic light emitting device realizes bottom emission of light.

Here, the first triplet exciton confinement layer 142 controls charge balance between the first light emitting layer 136, the first layer of the second light emitting layer 137 and the second layer of the third light emitting layer 144, facilitates transport of electrons and holes to the light emitting layer and thereby enhances electron/hole recombination in the light emitting layer and improves luminous efficacy.

Hereinafter, an example of performing a solution process applied to the hole injection layer, the hole transport layer, the red light emitting layer and the green light emitting layer of the organic light emitting device will be described.

Figure 3A:
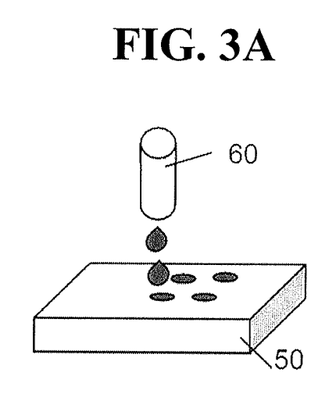
FIGS. 3A to 3C are views illustrating an example of a solution process of the organic light emitting device according to an embodiment of the present invention.
Figure 3B:
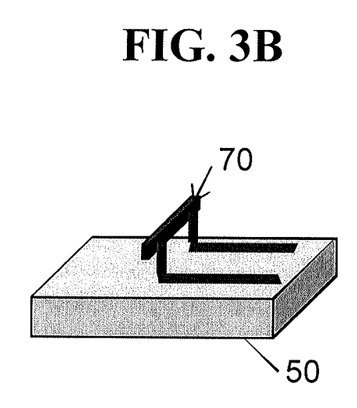
Figure 3C:
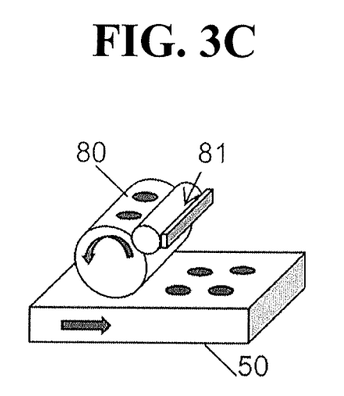

FIGS. 3A to 3C are views illustrating an example of a solution process of the organic light emitting device according to the present invention.

FIG. 3A illustrates inkjet printing which is performed through a head 60 having a plurality of injection holes capable of dropping dots on a substrate 50. In this case, during printing, the head 60 or the substrate 50 moves. Accordingly, fine control according to respective regions is possible. That is, selective dotting according to individual pixels in the organic light emitting device can be easily performed.

FIG. 3B illustrates nozzle printing which performs printing on the substrate 50 using a slit-shaped nozzle 70. Such a nozzle 70 may be provided in plural. Nozzle printing is suitable for printing patterns distributed in a wider region, as compared to inkjet printing. For example, in a case of an organic light emitting device provided with banks on the substrate, when predetermined layers are formed by an entire-surface nozzle printing method, regions can be divided via the banks.

FIG. 3C illustrates roll printing which is performed by rotating a patterned main roller 60 on a substrate 50 to form a printing pattern. In this case, an auxiliary roller 81 is connected to a head to which a printing solution is supplied, to induce continuous supply of the printing solution from the head to the pattern of the main roller 80. In some cases, when the main roller 80 is not patterned, application over the entire surface of the substrate 50 is possible.

As other examples of performing the solution process, there are transfer, gravure printing and thermal jet printing.

However, these examples are limiting examples of the solution process and other equipment according to development of equipment may be used, or the solution process may be carried out through other processes.

Hereinafter, the effects of the organic light emitting device according to the present invention demonstrated through testing will be described.

Figure 4:
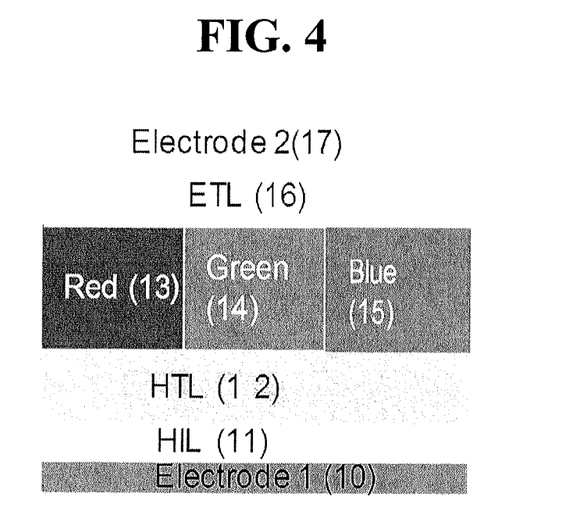
FIG. 4 is a sectional view illustrating a reference example compared with an organic light emitting device of an embodiment of the present invention.

FIG. 4 is a sectional view illustrating a reference example compared with organic light emitting devices of the present invention.

As shown in FIG. 4, the reference example does not include a triplet exciton confinement layer, and includes a hole injection layer 11, a hole transport layer 12, light emitting layers 13, 14 and 15 and an electron transport layer 16 formed between an anode 10 and a cathode 17. Also, the light emitting layers 13, 14 and 15 are separately defined as the red light emitting layer 13, the green light emitting layer 14 and the blue light emitting layer 15 according to individual pixels.

After the reference example shown in FIG. 4 is prepared, luminance, luminous efficacy, driving voltage and color coordinates of red, green and blue light-emission pixels, as well as the organic light emitting device are measured.

Here, the reference example and the organic light emitting device of the present invention include, in addition to the anode formed of a transparent material and the cathode formed of a reflective metal such as Al, a hole injection layer with a thickness of 40 nm, a hole transport layer with a thickness of 20 nm, a red light emitting layer with a thickness of 50 nm, a green light emitting layer with a thickness of 40 nm, a blue light emitting layer with a thickness of 25 nm, an electron transport layer with a thickness of 20 nm and an electron injection layer with a thickness of 0.5 nm in common. Meanwhile, the cathode formed to a thickness of 100 nm using Al is tested. Also, materials used for testing of the layers included in the reference example and the organic light emitting device of the present invention in common are identical. For example, PEDOT is used a material for the hole injection layer and LiF is used as a material for the electron injection layer.

Reference example and the present invention are the same in terms of materials for the remaining layers, and the present invention is distinguished from reference example in that the present invention includes the first and second triplet exciton confinement layers.

Figure 5:
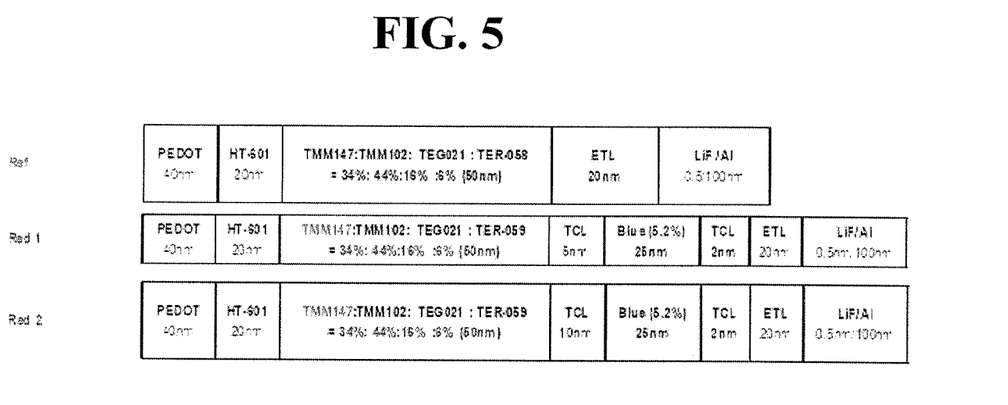
FIG. 5 is a view illustrating detailed configurations of red pixels in organic light emitting devices of an embodiment of the present invention and a reference example.

FIG. 5 is a view illustrating detailed configurations of red pixels in organic light emitting devices of the present invention and the reference example.

As shown in FIG. 5, regarding red pixels, efficacies of the reference example (Ref) and first and second examples (Red1 and Red2) according to the organic light emitting devices of the present invention in which a blue light emitting layer is formed on a red light emitting layer, and thicknesses of the first triplet exciton confinement layer are changed, are measured. That is, in the first example (Red1), the thickness of the first triplet exciton confinement layer was 5 nm and the thickness of the second triplet exciton confinement layer was 2 nm, while, in the second example (Red2), the thickness of the first triplet exciton confinement layer was 10 nm and the thickness of the second triplet exciton confinement layer was 2 nm.

As can be seen from Table 1, the reference example exhibits CIE color coordinate of (0.658, 0.340) which is substantially equivalent to that of pure red. This means that slight variance of color coordinate occurs, since the first and second examples according to the organic light emitting device of the present invention have a region where the red light emitting layer overlaps the blue light emitting layer. However, it can be seen that difference in color coordinate between reference example and first and second examples of the present invention is not great. The second example exhibits a luminance of 12 Cd/A, which is 20% higher than that of reference example and a luminous efficacy of 5.7 lm/W which is 16% or higher than that of the reference example.

That is, these results mean that, even in a hybrid device structure in which the red light emitting layer overlaps the blue light emitting layer, luminous efficacy of respective light emitting layers can be improved and color mixing cannot be prevented by forming a triplet exciton confinement layer on the upper and lower parts of the blue light emitting layer disposed in common according to individual pixels, like the organic light emitting device of the present invention.

TABLE 1

| @1000 nit | Cd/A | lm/W | V | CIE X | CIE Y |
|---|---|---|---|---|---|
| Ref | 10 | 4.9 | 5.2 | 0.658 | 0.340 |
| Red 1 | 8.1 | 4.7 | 5.4 | 0.654 | 0.342 |
| Red 2 | 12 | 5.7 | 5.5 | 0.640 | 0.352 |

Figure 6:
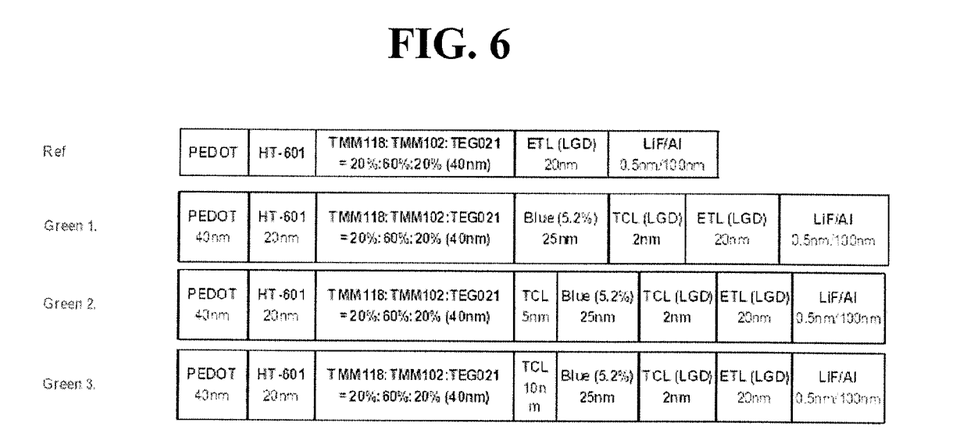
FIG. 6 is a view illustrating detailed configurations of green pixels in organic light emitting devices of the present invention and reference example.

FIG. 6 is a view illustrating detailed configurations of green pixels in organic light emitting devices of the present invention and the reference example.

The test shown in FIG. 6 and Table 2 relates to the reference example (Ref) of FIG. 4, first and second examples (Green 2 and Green 3) in which a blue light emitting layer is formed on the afore-mentioned green light emitting layer and the thickness of the first triplet exciton confinement layer is changed, and a first modified example (Green 1) according to the present invention in which the first triplet exciton confinement layer is not formed under the blue light emitting layer and only the second triplet exciton confinement layer is formed.

The test shown in FIG. 6 and Table 2 is performed on green pixels. This structure is different from the structure shown in FIG. 5 in that a green light emitting layer is formed as a light emitting layer and a blue light emitting layer overlapping the green light emitting layer is further formed in the first and second examples and the first modified example of the present invention.

In this case, as can be seen from Table 2 below, the reference example (Ref) exhibits CIE color coordinate of (0.33, 0.63) which are substantially equivalent to color coordinates of examples other than the modified example of the present invention. This means that, when the blue light emitting layer is formed on the green light emitting layer, and first and second triplet exciton confinement layers are formed on the top and bottom of thereof, color coordinates are substantially equivalent to those when only the green light emitting layer is included.

Also, regarding luminance and luminous efficacy, the second example of the present invention exhibits increased luminance and increased luminous efficacy of 52 Cd/A and 31.31 m/W, respectively. In all cases in which the first triplet exciton confinement layer is formed to a thickness of 10 nm, efficacy is good. Also, the first example (Green 2) has slightly lower efficacy than the reference example, but exhibits similar color coordinate to the reference example including only the green light emitting layer. This means that color purity of the hybrid device such as the organic light emitting device of the present invention is not decreased.

Also, these results mean that, even in a hybrid device structure in which the green light emitting layer overlaps the blue light emitting layer, luminous efficacy of respective light emitting layers can be improved and color mixing can be prevented by forming a triplet exciton confinement layer on the top and bottom of the blue light emitting layer disposed in common according to individual pixels, like the organic light emitting device of the present invention.

TABLE 2

| @1000 nit | Cd/A | lm/W | V | CIE X | CIE Y |
|---|---|---|---|---|---|
| Ref | 51.0 | 30.4 | 5.3 | 0.33 | 0.63 |
| Green 1 | 38.7 | 23.1 | 5.3 | 0.319 | 0.635 |
| Green 2 | 43.5 | 24.6 | 5.6 | 0.330 | 0.628 |
| Green 3 | 52 | 31.3 | 5.4 | 0.333 | 0.625 |

Figure 7:
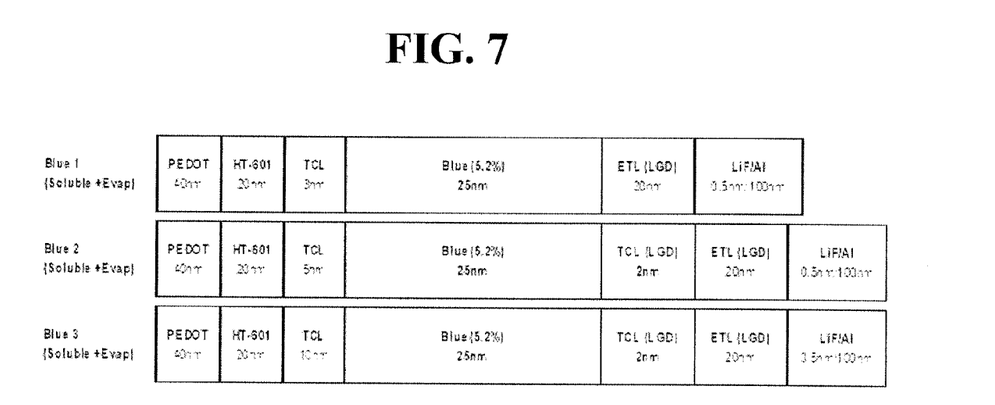
FIG. 7 is a view illustrating detailed configurations of blue pixels in organic light emitting devices according to an embodiment of the present invention.

FIG. 7 is a view illustrating detailed configurations of blue pixels in organic light emitting devices according to the present invention.

The test shown in FIG. 7 and Table 3 relates first and second examples (Blue 2 and Blue 3) and a second modified example of the present invention. Here, the second modified example represents a case in which only the first triplet exciton confinement layer is formed and the second triplet exciton confinement layer is not formed. Here, in the second modified example of the present invention, the thickness of the first triplet exciton confinement layer is 3 nm.

As shown in Table 3, comparing efficacy between the first and second examples and the second modified example according to the present invention, a case in which the first and second triplet exciton confinement layers are provided at both sides of the blue light emitting layer exhibits improvement in luminance as well as luminous efficacy and a decrease in driving voltage. As the thickness of the first triplet exciton confinement layer formed under the blue light emitting layer becomes near 10 nm, efficacy is increased.

Here, in the blue pixel, only a blue light emitting layer is formed. CIE color coordinates of (0.14, 0.10) are identical in the first and second examples, and the modified example according to the preset invention.

TABLE 3

| @1000 nit | Cd/A | lm/W | V | CIE X | CIE Y |
|---|---|---|---|---|---|
| Blue 1 | 5.8 | 4.3 | 4.3 | 0.14 | 0.10 |
| Blue 2 | 6 | 4.6 | 4 | 0.14 | 0.10 |
| Blue 3 | 6.5 | 4.9 | 4.1 | 0.14 | 0.10 |

As apparent from the test above, these results mean that, even in a hybrid device structure in which the blue light emitting layer overlaps other color light emitting layer, luminous efficacy of respective light emitting layers can be improved and color mixing cannot be prevented by forming a triplet exciton confinement layer on the top and bottom of the blue light emitting layer formed in common according to individual pixels, like the organic light emitting device of the present invention.

Hereinafter, a method for manufacturing the organic light emitting device of the present invention will be described in brief with reference to FIG. 1.

First, a TFT substrate 100 in which first to third pixels are disposed in a matrix form in this order is prepared. Here, the TFT substrate 100 includes a thin film transistor at each pixel.

Then, a first electrode 132 is formed on the substrate 100. The first electrode 132 is connected to the thin film transistor in each pixel.

Then, a first common layer 134 is formed on the first electrode 132 through a solution process.

Then, a first light emitting layer 136 and a second light emitting layer 137 are formed in the first pixel and in the second pixel, respectively, on the first common layer 134 through a solution process.

Then, a first triplet exciton confinement layer 142, a third light emitting layer 144, a second triplet exciton confinement layer 145 and a second common layer 146 are sequentially formed over the first to third pixels through a evaporation process such that these layers cover the first light emitting layer 136 and the second light emitting layer 137.

Then, a second electrode 148 is formed on the second common layer 146.

As such, according to the method for manufacturing the organic light emitting device of the present invention, the hybrid-type organic light emitting device fabricated through a combination of solution and deposition (evaporation) processes is used, and a triplet exciton confinement layer (TCL) is formed on the top and bottom of the third light emitting layer (blue light emitting layer) formed in respective pixels in common to confine excitons in the respective light emitting layers and thereby improve luminous efficacy and prevent color mixing of light emitting layer overlap regions.

As apparent from the fore-going, the organic light emitting device and the method of manufacturing the same according to the present invention have the following advantages.

First, interfacial contact between a light emitting layer formed through the solution process and a subsequently deposited layer can be improved by sequentially forming a first triplet exciton confinement layer, a blue light emitting layer and a second triplet exciton confinement layer by vacuum deposition, instead of forming a blue light emitting layer overlapping a red light emitting layer and a green light emitting layer by vacuum deposition, immediately after the red light emitting layer and the green light emitting layer are formed in the corresponding pixels through a solution method.

Second, excitons can be confined in the light emitting layer and luminous efficacy can thus be improved by providing a triplet exciton confinement layer at both sides of the light emitting layer. This prevents diffusion of excitons to an adjacent hole transport layer or an electron transport layer and thereby prevents deterioration in efficacy caused by exciton diffusion.

Third, interfacial properties between the surface of the light emitting layer formed through a solution process and the subsequently deposited layer (first triplet exciton confinement layer are stabilized and lifetime can be thus improved.

Fourth, although a region where a red or green light emitting layer overlaps a blue light emitting layer exists in a hybrid device structure, color mixing of this overlapping region is prevented and color purity can thus be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
a substrate divided into and defined by first to third pixels;
a first electrode disposed on the substrate and a second electrode facing the first electrode, the second electrode being spaced from the first electrode;
a first light emitting layer and a second light emitting layer disposed in the first pixel and in the second pixel, respectively, between the first electrode and the second electrode;
a first triplet exciton confinement layer, a third light emitting layer and a second triplet exciton confinement layer disposed over the first to third pixels in this order, on the first light emitting layer and the second light emitting layer;
a first common layer disposed between a layer including the first light emitting layer and the second light emitting layer, and the first electrode; and
a second common layer disposed between the second triplet exciton confinement layer and the second electrode.

2. The organic light emitting device according to claim 1, wherein the first and second triplet exciton confinement layers have an electron mobility of $1.0 \times 10^{-8}$ cm$^2$/s·V or more and a hole mobility of $1.0 \times 10^{-8}$ cm$^2$/s·V or more.

3. The organic light emitting device according to claim 2, wherein LUMO and HOMO energy levels of the first triplet exciton confinement layer are different from LUMO and HOMO energy levels of a host and a dopant, respectively, included in the third light emitting layer, within 0.5 eV or less and LUMO and HOMO energy levels of the second triplet exciton confinement layer are different from LUMO and HOMO energy levels of a host and a dopant, respectively, included in the third light emitting layer, within 0.5 eV or less.

4. The organic light emitting device according to claim 3, wherein triplet energy levels of the first and second triplet exciton confinement layers are higher than triplet energy levels of respective dopants of the first to third light emitting layers.

5. The organic light emitting device according to claim 1, wherein the first triplet exciton confinement layer has a thickness of about 1 nm to about 15 nm.

6. The organic light emitting device according to claim 1, wherein the second triplet exciton confinement layer has a thickness of about 1 nm to about 5 nm.

7. The organic light emitting device according to claim 1, wherein the first triplet exciton confinement layer and the second triplet exciton confinement layer comprise a low molecular organic material.

8. The organic light emitting device according to claim 1, wherein the first light emitting layer is a red light emitting layer, the second light emitting layer is a green light emitting layer and the third light emitting layer is a blue light emitting layer.

9. The organic light emitting device according to claim 1, wherein the first common layer, the first light emitting layer and the second light emitting layer comprise a solution material.

10. The organic light emitting device according to claim 1, wherein the substrate comprises a thin film transistor array including a thin film transistor connected to the first electrode in each pixel.

11. A method for manufacturing an organic light emitting device comprising:
preparing a substrate divided into and defined by first to third pixels;
forming a first electrode on the substrate;
forming a first common layer on the first electrode through a solution process;
forming a first light emitting layer and a second light emitting layer in the first pixel and in the second pixel, respectively, on the first common layer, through a solution process;
sequentially forming a first triplet exciton confinement layer, a third light emitting layer and a second triplet exciton confinement layer over the first to third pixels through a evaporation process such that these layers cover the first light emitting layer and the second light emitting layer; and forming a second electrode on the second common layer.

12. The method according to claim 11, wherein the solution process used for formation of the first common layer, the first light emitting layer and the second light emitting layer is selected from inkjet printing, nozzle printing, transfer, slit coating, gravure printing and thermal jet printing.

13. The method according to claim 11, wherein the formation of the first triplet exciton confinement layer and the second triplet exciton confinement layer is carried out by depositing small molecules organic materials.

* * * * *